United States Patent [19]

Kohtani et al.

[11] 4,396,955

[45] Aug. 2, 1983

[54] MUTING DEVICE

[75] Inventors: Yutaka Kohtani, Yokohama; Tadao Udagawa, Fukushima, both of Japan

[73] Assignee: Canon Kabushiki Kaisha, Tokyo, Japan

[21] Appl. No.: 275,360

[22] Filed: Jun. 19, 1981

[30] Foreign Application Priority Data

Jun. 25, 1980 [JP] Japan .............................. 55-88985[U]

[51] Int. Cl.³ ....................... G11B 15/04; G11B 15/12
[52] U.S. Cl. .......................................... 360/60; 360/61
[58] Field of Search ............................... 360/60, 61, 65

[56] References Cited

U.S. PATENT DOCUMENTS 3,721,774  3/1973  Yonemoro et al. .................... 360/61
4,090,224  5/1978  Sato ....................................... 360/60
4,263,626  4/1981  Kobayashi ............................ 360/60

Primary Examiner—Vincent P. Canney

Attorney, Agent, or Firm—Toren, McGeady and Stanger

[57] ABSTRACT

In a recording apparatus for performing magnetic recording onto different parts of a magnetic recording medium as it runs in sequence, a switching element is connected in series in a signal path to a magnetic head which is connected to the output of the signal amplifier and to a bias oscillator. Accordingly, the signal current flowing to the magnetic head can be interrupted. A delay circuit is provided for controlling the operation of the switching element so as to defer initiation of the signal current flow to the magnetic head. This is done pending attainment of the speed of movement of the magnetic recording medium to a substantially constant level after the magnetic recording starts. Connected in parallel to the switching element is a by-pass circuit of which the impedance is relatively low at a frequency equal to that of the bias supplied to the magnetic head. A stabilized muting effect from the low to the high sound region thus can be produced.

4 Claims, 6 Drawing Figures

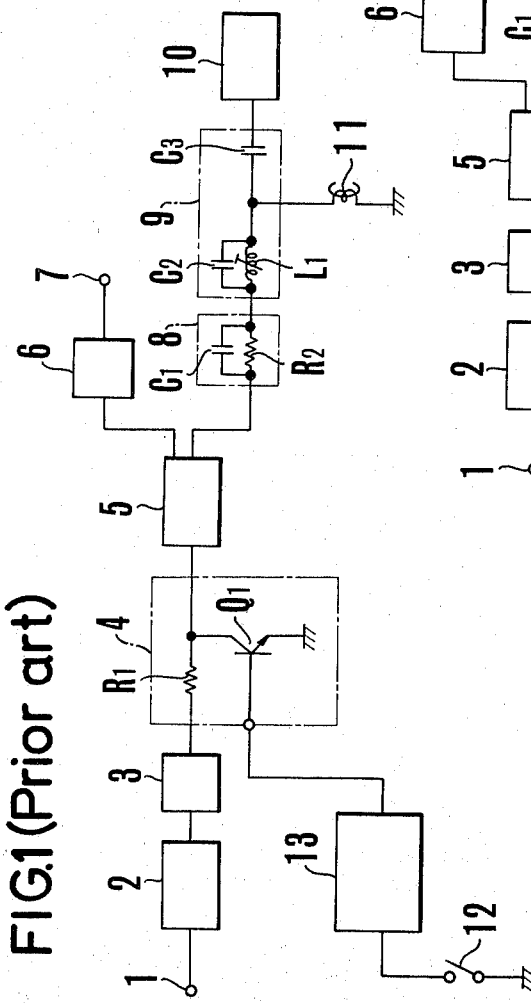
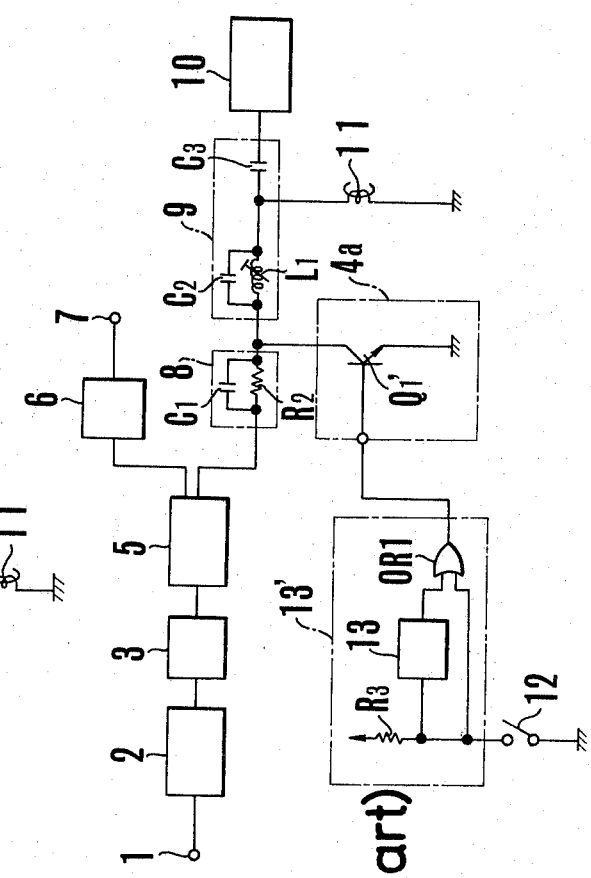
FIG.1 (Prior art)
FIG.2 (Prior art)

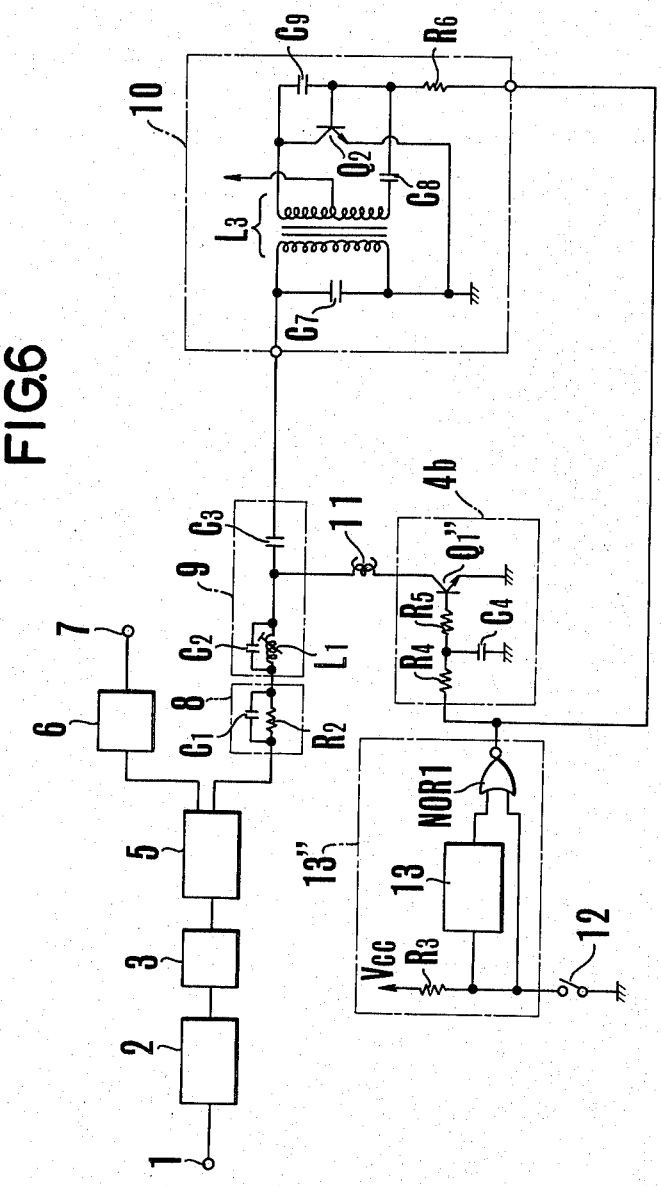

MUTING DEVICE

BACKGROUND OF THE INVENTION

This invention relates to magnetic recording systems, and, more particularly, to a muting device for use when starting a recording operation.

The conventional use of magnetic recording systems in, for example, cine cameras includes a motion picture film provided with a magnetic coating in a stripe, so that the sound can be recorded at the same time as when motion pictures are taken, and the so-called simultaneous sound recording cine cameras are put into practical use.

With such cameras, when taking a motion picture with sound accompaniment, and particularly at the time when the film starts to move, it takes a certain length of time for the film transport system comprising the capstan and the fly wheel to attain stabilization.

Therefore, making a sound recording during this time is not recommended because, upon later reproduction, the sound pitch is distorted. Nevertheless, since particularly in sound motion picture cameras the time necessary to take one scene is very short, much account is given the recording and reproducing characteristics at the time of start of each scene. Further, in many cases, the motion pictures and the sound accompaniment are recorded on one and the same medium, so that it is very difficult to cut off that portion of the recording medium which reproduces noise.

To eliminate such drawbacks, according to the prior art, devices as shown in FIGS. 1 and 2 have been proposed. The device of FIG. 1 is applied to a sound recording system in the simultaneous sound recording cine camera. The system is shown in block form as comprising a signal input 1, for example, in the form of a jack for microphone, a pre-amplifier 2, and a sound volume adjusting means 3. A muting circuit 4 includes a resistor $R_1$ and a transistor $Q_1$ as a variable impedance element. The system further includes an amplifier 5 for sound recording, a second amplifier 6 for monitor with an output terminal 7 in the form of a jack for monitor, a constant current forming and equalizer circuit 8 which comprises a resistor $R_2$ having a large resistance value as compared with the impedance of a magnetic head 11 to be described later, and a condenser $C_1$. A superimposing circuit 9 for superimposing the input signal on a bias from a bias oscillator 10 comprises a condenser $C_2$ resonant with the frequency of the bias, a resonator circuit having an inductor $L_1$, and a condenser $C_3$. Also shown is the bias oscillator 10 for high-frequency bias, and the magnetic head 11. A switch 12 is closed when a camera release button (not shown) is actuated. A monostable multivibrator 13 produces a control signal of high level for a predetermined time after the closure of said switch 12 at an output terminal thereof, the output terminal being connected to the base of the transistor $Q_1$.

In operating the system of such construction, prior to the taking of a motion picture, a main switch (not shown) is thrown to supply the sound recording system of FIG. 1 and an exposure control system (not shown) with electrical current, thereby the pre-monitor of a sound recording, and picture taking, are made possible. That is, a more detailed explanation about the sound recording system is given below by reference to FIG. 1. The jack 1 is supplied with a sound signal from a microphone (not shown). Then, the sound signal is amplified by the pre-amplifier 2 and, after having been adjusted to a proper level by the control means 3, is then supplied to the muting circuit 4. Here the potential at the base of the transistor $Q_1$ is yet of low level, permitting the sound signal to be applied without attenuation to the amplifier 5 for sound recording which then produces two outputs. One of the outputs is applied to the amplifier 6 for monitor and therefrom to the jack 7 for monitor. With the use of a monitor device such as an ear-phone, as connected to the jack 7, the sound which is about to be recorded can be monitored. The other output of the amplifier 5 for sound recording is applied to the constant current forming and equalizer circuit 8 and is then superimposed on the bias from the oscillator 10 before it is applied to the magnetic head 11. Since in this stage the film is not yet run, a sound recording is not initiated. Then, when the camera release button is actuated to initiate a picture taking operation, the film is caused by a mechanism (not shown) to move. At this time, the switch 12 is synchronously closed, causing the mono-stable multi-vibrator 13 to produce a signal which remains at high level until the film transport system including the capstan and fly wheel (not shown) becomes stable from the output terminal thereof. Responsive to this signal, the transistor $Q_1$ lowers the impedance between the collector and emitter thereof sufficiently as compared with the resistance value $R_1$. Therefore, the output signal of the amplifier 3 is barely transmitted to the amplifier 5. In short, so long as the output of the multi-vibrator 13 is of high level, the monitor jack 7 and magnetic head 11 are not supplied with a sound signal. After that, as the film transport system becomes stable, the output of the mono-stable multi-vibrator 13 changes to low level, so that the impedance between the collector and emitter of the transistor $Q_1$ becomes high as compared with the resistor 11, and there is little attenuation by the muting circuit 4. Therefore, a sound signal flow to the monitor jack 7 and magnetic head 11 is initiated, thus enabling the sound signal to be monitored and to be recorded. In other words, the actuation of the muting circuit is made to continue until the film transport system becomes stable and, therefore, no sound recording is made possible during that time, thus making it possible to prevent the reproduction of a sound of different pitch during film reproduction. But, such arrangement has a drawback that after the actuation of the camera release, no monitor sound can be heard so long as the muting circuit is under operation. Another drawback is that since during the pre-monitor before the actuation of the camera release a portion of the sound signal is supplied to the magnetic head, the magnetic band is, though linewise, magnetized through the magnetic head. This becomes a cause of producing noise when the film is being reproduced. To eliminate these drawbacks, an alternate arrangement of the muting device as shown in FIG. 2 has been considered. The same reference numerals have been employed in FIG. 2 to denote similar parts to those shown in FIG. 1, and no more explanation of their operation is given below.

In the arrangement of FIG. 2, the muting circuit 4a is connected to the output side of the constant current forming and equalizer circuit 8. Further, instead of the mono-stable multi-vibrator 13, there is provided a muting signal forming circuit 13'. The muting signal forming circuit 13' comprises a mono-stable multi-vibrator 13, a logic OR circuit $OR_1$ and a resistor $R_3$, these parts being arranged as shown in FIG. 2.

Therefore, said muting signal forming circuit 13′ produces an output signal which goes to high level when in the pre-monitor prior to the actuation of release, or when the film running after the release is unstable, and which changes to low level when the film running is stabilized after the release.

With this construction and arrangement, during the time when muting is in operation, there is no possibility of loss of monitor sound, and since during the monitor no sound signal is supplied to the magnetic head, there is also no possibility of occurrence of magnetization of the sound recording track on the film. Thus, the drawbacks of the system of FIG. 1 are eliminated. However, unlike said muting circuit which is so constructed that attenuation is carried out by the divided voltage with the impedance of the constant current forming resistor $R_2$ and the saturated resistance value of the transistors $Q_1'$, in many cases a condenser $C_1$ is connected to the constant current forming resistor $R_2$ in parallel to result in an increase of the high-pass sound recording current value, thereby forming an equlizer for sound recording.

For this reason, when the muting transistor $Q_1'$ is saturated, the amount of attenuation at the high frequency is not very sufficient since it depends upon the impedance of the condenser $C_1$ and the impedance of the transistor $Q_1'$ when saturated.

Another problem arises from the fact that the magnetic head adapted to be used in the simultaneous sound cine camera is difficult to increase in bulk and size from the standpoint of compatibility with the film magazine, and, therefore, the number of turns of the coil around the head core cannot be set at a desired high value, thus leading to the impossibility of providing for a head with a large impedance. Particularly at low frequencies, the impedance is at a low value.

Therefore, when muting, the impedance cannot assume a sufficiently high value as compared with the saturation resistance value of the transistor $Q_1'$, and this problem becomes serious particularly when the frequency is low. Thus, it is difficult to assure a sufficient muting effect not only in the high region, but also in the low region.

SUMMARY OF THE INVENTION

It is an object of the present invention to eliminate all the above-mentioned drawbacks of the conventional muting device.

Another object of the present invention is to provide a muting device which has a stabilized muting effect over a range from the low to the high region.

One of the features of the present invention is that the magnetic head is provided with switching means connected in series thereto and arranged to be open until the film transport system becomes stable as it starts to move in response to the actuation of a camera release.

The second feature is that connected to the aforesaid switching means is, in parallel, a resonating circuit which resonates at a frequency almost equal to the frequency of the bias and of which the impedance is lowered at that frequency.

The third feature is that connected to said switching means is, in parallel, a condenser which has a high impedance value for the sound signal frequencies, and a low impedance value for the bias frequency.

BRIEF DESCRIPTION OF THE DRAWINGS:

FIG. 1 is a schematic view, partly in block form, of a first example of a conventional muting circuit in the sound recording system.

FIG. 2 is a similar view showing a second example of the conventional muting circuit.

FIG. 6 is an electrical circuit diagram of a fourth embodiment of the muting device according to the present invention.

DESCRIPTION OF THE PREFERRED EMBODIMENTS

The present invention will next be described in connection with embodiments thereof by reference to the drawings.

Figure 3:
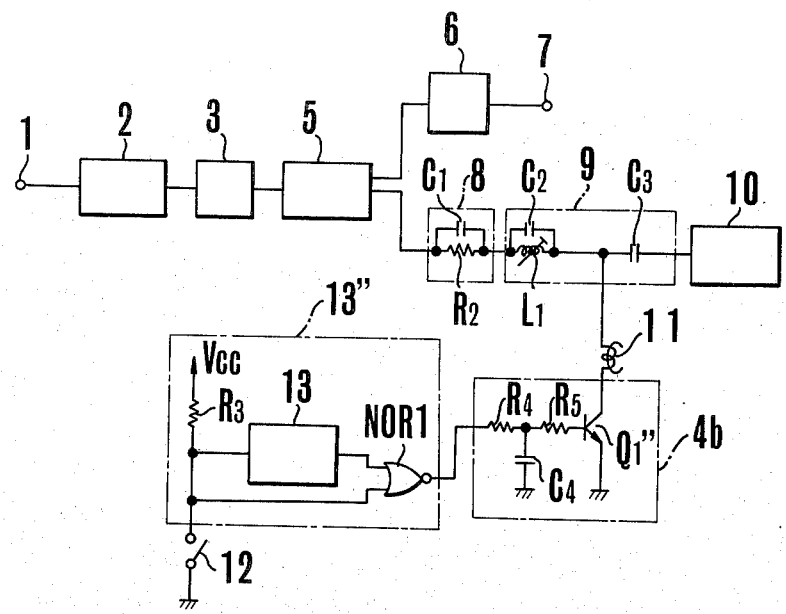
FIG. 3 is an electrical circuit diagram of one embodiment of a muting device according to the present invention.

In FIG. 3, there is shown a sound recording system employing the muting circuit of the present invention, where the same reference numerals have been employed to denote similar parts to those shown in FIGS. 1 and 2 with the omission of their explanation. A muting circuit 4b includes a switching transistor $Q_1''$, an integrator comprising a resistor $R_4$ and a condenser $C_4$, and a base resistor $R_5$. A muting signal forming circuit 13″ includes a resistor $R_3$ connected between a voltage source Vcc and the switch 12, a mono-stable multi-vibrator 13 with its trigger terminal connected to a point on the connection between the resistor $R_3$ and the switch 12, and a NOR circuit $NOR_1$ having two inputs one of which is connected to the output terminal of the mono-stable multi-vibrator 13 and the other of which is connected to the above connection point. The output of the circuit 13″, or the output of $NOR_1$ is connected to one end of the resistor $R_4$ in the muting circuit 4b.

In operating the system of FIG. 3, prior to the taking of a motion picture, the operator turns on a switch (not shown) to make a pre-monitor of sound recording and motion picture taking, as a microphone (not shown) produces a sound signal which enters the system at the jack 1. This sound signal after being amplified in passing through the pre-amplifier 2, and adjusted to an appropriate level by the volume control 3, is applied to the sound recording amplifier 5. One of the two outputs of the amplifier 5 is applied to the monitoring amplifier 6 having an output which is applied to the monitor jack 7. With an ear-phone (not shown) or other suitable monitor device connected to the jack 7, the operator is able to monitor that sound which is about to be recorded.

The other output of the sound recording amplifier 5 is applied to the constant current forming and equalizer circuit 8 having an output which is then applied to the bias superimposing circuit 9, where the bias from the oscillator 10 is superimposed on the output of the equalizer 8. Then the output of the circuit 9 is applied to the magnetic head 11.

At this time, however, the switch 12 is open, permitting a signal of high level to appear at one of the inputs of the NOR circuit. Therefore, the output of the NOR circuit is at low level at which the transistor $Q_1''$ is in the non-conducting state. Therefore, no sound signal current and no bias current flow to the magnetic head 11, thus giving an advantage that the otherwise resulting magnetization of the sound recording track can be avoided.

Then, when initiating a motion picture taking operation, the operator will actuate the release button on the camera housing, so that the film starts to run as it is driven to move by a mechanism (not shown). Such actuation of the release button also causes closing of the switch 12, which in turn causes the mono-stable multi-vibrator 13 to change its output to high level. Then, this output is maintained at the high level for a prescribed time interval in which the speed of the film transport system including the capstan and fly wheel attains the constant level. Meanwhile, responsive to this output of high level, the NOR circuit $NOR_1$ changes its output to low level, as the other input is at low level. The output of the NOR circuit $NOR_1$ is maintained at the low level until the output of the mono-stable multi-vibrator is changed to the low level again. This leads to prohibit a sound signal current and bias current from flowing to the magnetic head 11 until the film transport system is stabilized. As the speed of the film reaches the satisfactory level, the output of the mono-stable multi-vibrator 13 changes to low level and the output of the NOR circuit $NOR_1$ to high level. This change of the signal level, after having been somewhat displayed in the rise time by the integrator circuit $R_4$, $C_4$, is applied to the base of the transistor $Q_1''$, and the transistor $Q_1''$ is rendered conducting. Thus, the magnetic head is supplied with the bias-superimposed sound signal current, and while a motion picture is taken on the film, a sound accompaniment is magnetically recorded on the same medium or film.

When terminating the motion picture taking operation, the operator removes his finger from the depression of the release button, thereby the switch 12 is opened again. Then, the output of the NOR circuit $NOR_1$ changes to low level, causing the charge stored on the condenser $C_4$ to be discharged and therefore causing the transistor $Q_1''$ to be non-conducting. Thus, the magnetic recording operation is terminated. Also, the film transport system (not shown) is also stopped.

It should be pointed out in connection with the above construction and arrangement of the circuit, that a sufficient base current is allowed to flow to the transistor $Q_1''$ so that the transistor $Q_1''$ functions as a switching means with an advantage that the impedance ratio when conducting to that when non-conducting can be made sufficiently large, and the muting effect exhibits itself sufficiently.

It is noted that the reason the switching speed is slowed down by the use of the integrator circuit is to avoid the production of noise when the sound is reproduced, as the otherwise rapid change of the head current results in a D.C. like magnetization of the sound recording track on the film.

Figure 4:
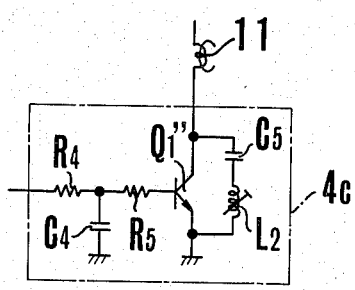
FIG. 4 is an electrical circuit diagram of a second embodiment of the muting device according to the present invention.
Figure 5:
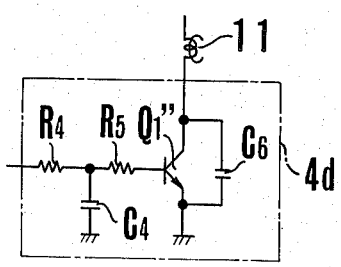
FIG. 5 is an electrical circuit diagram of a third embodiment of the muting device according to the present invention.

FIGS. 4, 5 and 6 show three other embodiments of the invention as modified from the above embodiment of FIG. 3.

The embodiment of FIG. 4 employs a series-connected circuit of a condenser $C_5$ and an inductor $L_2$, or a resonating circuit for connection in parallel with the transistor $Q_1''$ in the muting circuit 4b of FIG. 3. And, this resonating circuit is so designed as to have a resonant frequency almost equal to the high frequency of the bias from the oscillator 10.

Accordingly, the series-connected resonating circuit of the condenser $C_5$ and the inductor $L_2$ is caused to decrease its impedance only at the frequency of the bias. Therefore, even when the transistor $Q_1''$ is in non-conducting state, the flow of the bias current to the head is always assured.

The reason why such series resonating circuit is provided in parallel to the transistor $Q_1''$ is explained below.

In general, where the magnetic recording of the sound signal is carried out in the bias-superimposed form, the bias current is of a higher level than that of the sound recording current by about one place, and the higher the frequency, the higher the impedance of the head becomes. Therefore, a far larger proportion of the voltage applied on the head is occupied by the bias voltage than by the sound signal voltage. Therefore, a high alternating voltage is applied by the bias signal to the switching transistor, depending upon the impedance of the head.

Now assuming that, as the switching transistor $Q_1''$, use is made of, for example, an NPN type transistor, then the collector-base path is rendered conducting by the negative cycles of the high frequency bias, and a negative large voltage with respect to the earth level is applied to the base. If this applied voltage exceeds the rated reverse voltage across the base-emitter path of the transistor, the transistor $Q_1''$ is destroyed.

The circuit constructions of FIGS. 4, 5 and 6 aim at a solution of such problem. In FIG. 4, only the bias current is caused to flow through the series resonating circuit comprising the condenser $C_5$ and the inductor $L_2$, thus preventing the damage of the transistor resulting from the application of an excessive voltage thereon.

It is noted that the supply of only bias current to the head does not lead to form a residual magnetic field in the recording track on the film.

FIG. 5 shows still another embodiment of the invention where instead of the resonating circuit of FIG. 4, only one condenser $C_6$ is used and is arranged to flow the bias current therethrough. Here the value of the condenser $C_6$ must be determined to have a high impedance for the sound signal frequencies, and a low impedance for the bias frequency. This is readily set in, provided that the frequency of the bias is adjusted to a sufficiently higher value than that of the sound to be recorded, for example, as high as ten times.

Next, FIG. 6 shows a further embodiment of the invention as modified from the embodiment of FIG. 3 with the use of such an arrangement that the operation of the high frequency oscillator 10 for the high frequency bias is controlled together with the operation of the transistor $Q_1''$ as the switching means connected in series to the magnetic head. Therefore, the oscillation of the bias is stopped during the time when the supply of a sound recording current to the magnetic head 11 is cut off, thus protecting the transistor $Q_1''$ from damages due to the excessive voltage applied across the base-emitter path thereof.

A detailed explanation is given below.

In FIG. 6, the same reference numerals have been employed to denote the similar parts to those shown in FIG. 3.

The high frequency bias oscillator 10 includes a transformer $L_3$; condensers $C_7$ to $C_9$; and NPN type transistor $Q_2$, these parts constituting a known oscillation circuit. Since the base of the transistor $Q_2$ is connected through a resistor $R_6$ to the output of the above-described NOR gate $NOR_1$ when the output of the NOR gate $NOR_1$ is of high level, it oscillates, and when of low level, no oscillation occurs.

Therefore, after the actuation of the release switch 12, the NOR gate produces output of high level until the prescribed time T elapses, so that during this time, or only when the transistor $Q_1''$ is ON and a muting is under action, the bias oscillation is allowed to occur.

With such construction, even when the transistor $Q_1''$ is OFF, the bias of high frequency is not applied to said transistor $Q_1''$, thus avoiding its destruction.

It is noted that this embodiment has been described as the film is allowed to run during a time interval (hereinafter referred to as time T) from the moment at which the release button on the camera has been actuated to the moment at which the film transport system is stabilized. It is to be understood that the principles of the invention are applicable to cameras of the type such that after the film transport system has been stabilized, the pinch roller is brought into pressing engagement of the film against the capstan, or in other words, the film does not start to run until the transport system is stabilized.

That is, an advantage of the invention is that when the pre-monitor is under operation, or during the time T, the supply of a sound recording current to the magnetic head is interrupted to thereby prevent the magnetization of the sound recording track on the film, and therefore to make it possible to remove noise during film reproduction. Another advantage is that as a camera release is actuated, no problems wherein the monitor sound disappears during the time when the muting circuit is under action, and an ambient noise is recorded during that time, arise. A further advantage is that the muting effect exhibits itself sufficiently over a range from the low to the high region. Thus, the present invention has many advantages particularly when applied to simultaneous sound recording cine cameras.

The present invention has been described as applied to the simultaneous sound recording cine camera, but it is not confined to such cine cameras. In all recorders where the magnetic recording is performed, the improved muting device of the invention can be used to remove the unstable starting-up of recording as the recording medium is driven to move.

What is claimed is:

1. A muting device for use in magnetic recording apparatus in which magnetic recordings are produced by a magnetic head onto different portions of a relatively movable magnetic recording medium when signal currents flow through a signal path including said magnetic head, comprising:
    (a) switching means connected in the signal path of the magnetic head in series to said magnetic head so that a signal current flowing to said magnetic head can be interrupted;
    (b) release means for producing a release signal for initiating relative movement of the magnetic recording medium with respect to said magnetic head; and
    (c) delay control means for rendering the switching means conductive after the elapse of a predetermined time from the production of said release signal from said release means, and including bias means for biasing said signal current flowing to the magnetic head by a high frequency wave, and by-pass means connected in parallel to said switching means wherein the impedance of said by-pass means is lowered at the frequency of said high frequency bias.

2. A muting device according to claim 1, wherein said by-pass means comprises a series resonant circuit which is resonant at the frequency of the high frequency bias.

3. A muting device according to claim 1, wherein said by-pass means comprises a condenser having a low impedance value for the frequency of the high frequency bias and a high impedance value at sound signal frequencies.

4. A muting device for use in magnetic recording apparatus in which magnetic recordings are produced by a magnetic head onto different portions of a relatively movable magnetic recording medium when signal currents flow through a signal path including said magnetic head, comprising:
    (a) switching means connected in the signal path of the magnetic head in series to said magnetic head so that a signal current flowing to said magnetic head can be interrupted;
    (b) release means for producing a release signal for initiating relative movement of the magnetic recording medium with respect to said magnetic head; and
    (c) delay control means for rendering the switching means conductive after the elapse of a predetermined time from the production of said release signal from said release means, and including a high frequency oscillator having an output for biasing said signal current flowing to the magnetic head, and the high frequency oscillator and said switching means are arranged to cooperate with each other so that during the time when the switching means interrupts the signal current flowing to the magnetic head, the high frequency oscillator ceases oscillation, and during the time when said signal current is allowed to flow to the magnetic head, the high frequency oscillator oscillates.

* * * * *